(12) United States Patent
Masleid et al.

(10) Patent No.: US 9,509,317 B2
(45) Date of Patent: Nov. 29, 2016

(54) ROTATIONAL SYNCHRONIZER CIRCUIT FOR METASTABLITY RESOLUTION

(71) Applicant: Oracle International Corporation, Redwood City, CA (US)

(72) Inventors: Robert P Masleid, Monte Sereno, CA (US); Ali Vahidsafa, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 157 days.

(21) Appl. No.: 13/755,056

(22) Filed: Jan. 31, 2013

(65) Prior Publication Data

US 2014/0210526 A1  Jul. 31, 2014

(51) Int. Cl.
  *H03L 7/00*  (2006.01)
  *H04L 7/02*  (2006.01)
  *H04L 25/05*  (2006.01)
  *H04L 7/00*  (2006.01)

(52) U.S. Cl.
  CPC ............... *H03L 7/00* (2013.01); *H04L 7/005* (2013.01); *H04L 7/02* (2013.01); *H04L 25/05* (2013.01)

(58) Field of Classification Search
  USPC ........................................................ 327/152
  See application file for complete search history.

(56) References Cited

U.S. PATENT DOCUMENTS

| 5,045,801 | A  |    | 9/1991  | Mowery |               |
|-----------|----|----|---------|--------|---------------|
| 5,598,113 | A  |    | 1/1997  | Jex et al. |            |
| 6,137,851 | A  |    | 10/2000 | Erickson et al. |       |
| 6,693,569 | B2 | *  | 2/2004  | Takahashi | H03M 7/20  |
|           |    |    |         |        | 327/141       |
| 6,819,156 | B1 | *  | 11/2004 | Nix ................................ 327/218 |
| 2002/0084809 | A1 | * | 7/2002 | Okuno ............... H02M 3/1588 |
|           |    |    |         |        | 327/108       |
| 2008/0232179 | A1 | * | 9/2008 | Kwak ........................... 365/194 |

FOREIGN PATENT DOCUMENTS

WO       2009074603       6/2009

OTHER PUBLICATIONS

International Search Report and Written Opinion from PCT/US2014/014114, mailed Apr. 8, 2014, pp. 1-11.

* cited by examiner

*Primary Examiner* — Lincoln Donovan
*Assistant Examiner* — Patrick Chen
(74) *Attorney, Agent, or Firm* — Meyertons, Hood, Kivlin, Kowert & Goetzel, P.C.; Erik A. Heter (57) ABSTRACT

A rotational synchronizer for metastability resolution is disclosed. A synchronizer includes a plurality of M+1 latches each coupled to receive data through a common data input. The synchronizer further includes a multiplexer having a N inputs each coupled to receive data from an output of a corresponding one of the M+1 latches, and an output, wherein the multiplexer is configured to select one of its inputs to be coupled to the output. A control circuit is configured to cause the multiplexer to sequentially select outputs of the M+1 latches responsive to N successive clock pulses, and further configured to cause the M+1 latches to sequentially latch data received through the common data input.

20 Claims, 10 Drawing Sheets

ROTATIONAL SYNCHRONIZER CIRCUIT FOR METASTABLITY RESOLUTION

BACKGROUND

1. Technical Field

This disclosure is related to integrated circuits, and more particularly, to circuits for synchronizing signals passed from one clock domain to another.

2. Description of the Related Art

Modern integrated circuits often times include multiple functional blocks that are in different clock domains and/or voltage domains from one another. Circuits in different clock domains do not share a common clock signal, and their respective clock signals may operate at different frequencies. Circuits in different voltage domains may receive power at different voltages from one another. Despite the differences in operating clock frequencies and received voltages, circuits in different clock domains and/or voltage domains may nevertheless be arranged for communications with one another. Accordingly, various types of circuits may be provided in order to transfer signals from one clock and/or voltage domain to another.

For transmission of signals between first and second clock domains operating at different frequencies, a synchronizer may be used. A synchronizer may be implemented using a chain of serially coupled master-slave flip-flops. Since the clock domains may be operating at different frequencies, there is no guaranteed relationship between data signals received from the transmitting clock domain and a clock signal in the receiving clock domain. If a data signal arrives such that setup and hold time requirements are not satisfied, it is possible that the first flip-flop may enter a metastable state. In a metastable state, a state element (such as that in a flip-flop) may be in state of unstable equilibrium in which neither a logic 1 or a logic 0 is stored. Over the course of several clock cycles, the serially coupled chain of flip-flops used to implement the synchronizer may resolve the metastability, outputting a logic 1 or a logic 0 from the final flip-flop of the chain.

For transmission of signals between first and second voltage domains receiving power at different supply voltages, level shifter circuits may be used. A level shifter circuit may receive logic signals having a first voltage swing and output corresponding logic signals having a second voltage swing. In some level shifters, the first voltage swing may be greater than the second voltage swing. In other level shifters, the first voltage swing may be less than the second voltage swing.

SUMMARY OF THE DISCLOSURE

A rotational synchronizer for metastability resolution is disclosed. In one embodiment, a synchronizer includes a plurality of M+1 latches each coupled to receive data through a common data input. The synchronizer further includes a multiplexer having a N inputs each coupled to receive data from an output of a corresponding one of the M+1 latches, and an output, wherein the multiplexer is configured to select one of its inputs to be coupled to the output. A control circuit is configured to cause the multiplexer to sequentially select outputs of the M+1 latches responsive to N successive clock pulses, and further configured to cause the M+1 latches to sequentially latch data received through the common data input.

In one embodiment, a method includes sequentially selecting inputs of a multiplexer, wherein each of the inputs of the multiplexer is coupled to an output of a corresponding one of M+1 latches, wherein the multiplexer includes N inputs, and where the inputs are selected one at a time. The method further includes sequentially latching data into two or more of the M+1 latches, wherein each of the M+1 latches is coupled to receive data through a common data input. Each of the M+1 latches is configured to latch data responsive to receiving a particular one of two or more successive clock pulses during a same clock pulse when its output is selected as an input to the multiplexer, wherein data is latched into the two or more of the M+1 latches one latch at a time.

BRIEF DESCRIPTION OF THE DRAWINGS

Other aspects of the disclosure will become apparent upon reading the following detailed description and upon reference to the accompanying drawings which are now described briefly as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims.

DETAILED DESCRIPTION

Figure 1:
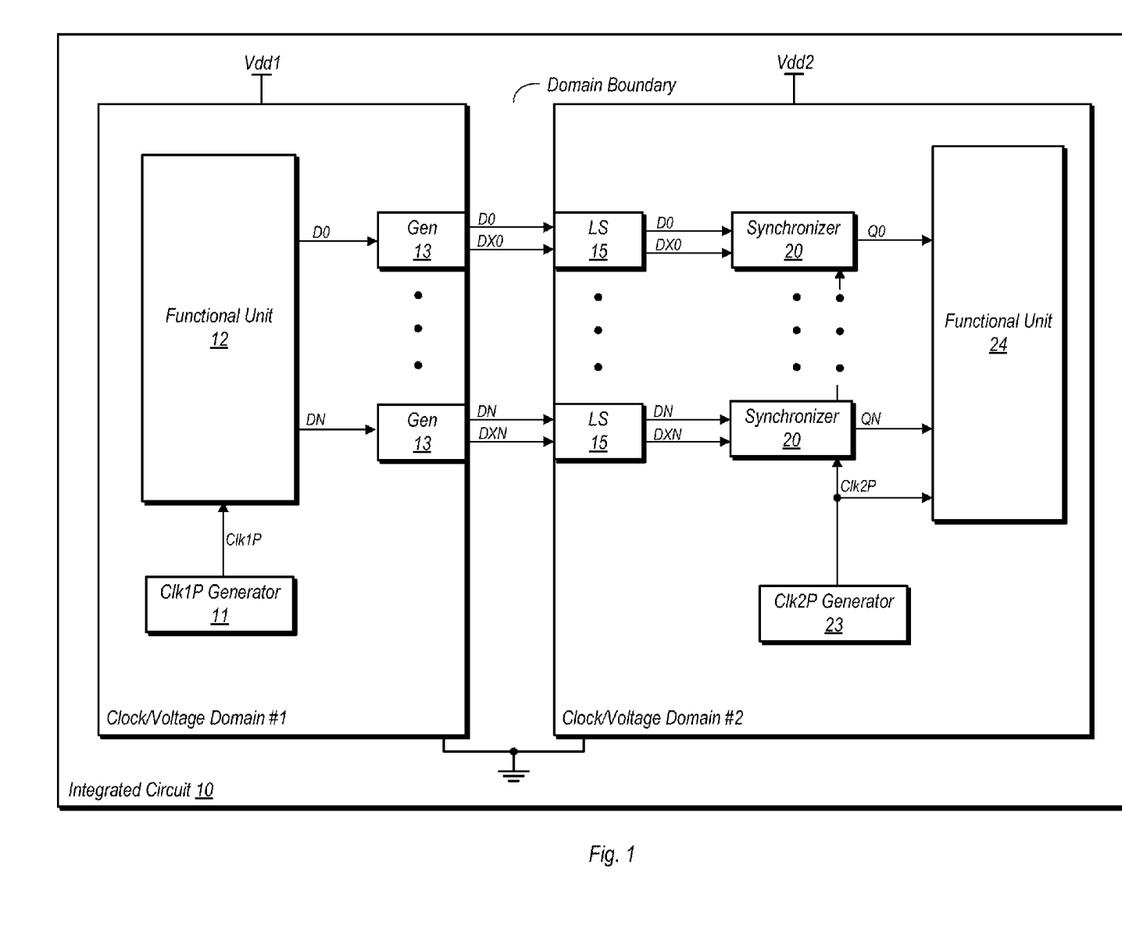
FIG. 1 is a block diagram of one embodiment of an integrated circuit (IC) having multiple voltage domains and multiple clock domains.

Turning now to FIG. 1, a block diagram of one embodiment of an integrated circuit (IC) is shown. It is noted that IC 10 in the embodiment shown is an exemplary embodiment, and thus other embodiments are possible and contemplated. Certain components of IC 10 are shown here for illustrative purposes, although it is to be understood that IC 10 may include other components that are not explicitly shown nor discussed herein. It is also noted that in some embodiments, the clock and voltage domains are not necessarily coincident, but are shown in such a manner here for illustrative purposes.

A first supply voltage, Vdd1, is provided to the circuits of clock/voltage domain #1 ('the first domain') in the illustrated embodiment. Similarly, the circuits of clock/voltage domain #2 ('the second domain') are coupled to receive a second supply voltage, Vdd2. These two supply voltages may be different from one another in various embodiments. In some embodiments, these two supply voltages may be adjustable independently of one another to accommodate desired power and/or performance levels. Thus, embodiments are possible and contemplated wherein at certain times the first and second supply voltages are different from one another, while at other times the first and second supply voltages are the same. Embodiments in which the first and second supply voltages are set at substantially fixed values are also possible and contemplated.

IC 10 in the embodiment shown includes a first functional unit 12 in a clock/voltage domain #1. A second functional unit 24 is included in clock/voltage domain #2. It is noted that in some embodiments, the clock and voltage domains are not necessarily coincident, but are shown in such a manner here for illustrative purposes. Clock/voltage domain #1 may operate according to a first clock signal, Clk1P, generated by clock generator 11 (which may be any suitable type of clock generation circuit). That is, synchronous circuits within clock/voltage domain #1 may be synchronized to the first clock signal. Synchronous circuits of clock/voltage domain #2 may be synchronized by a second clock signal, Clk2P, generated by clock generator 23 (which may be similar to clock generator 11). The first and second clock signals may operate at different frequencies. In some embodiments, the frequency of the first and/or second clock signals may be adjustable independently of one another to accommodate a desired performance level or a desired power consumption level. Thus, it is possible in some embodiments that, at times, the respective frequencies of the first and second clock signals may be equal, while at other times, the frequencies may be different. Embodiments in which the two clock frequencies are fixed at values that are different from one another are also possible and contemplated.

Functional unit 12 may, during operation of IC 10, send data to functional unit 24. Since these two functional units are in different clock and voltage domains, signals conveyed from functional unit 12 in clock/voltage domain #1 are conditioned for reception by functional unit 24 in clock/voltage domain #2. In IC 10, functional unit 12 may transmit a plurality of N+1 data signals (where N is an integer number), D0 to DN that carry data to be received by functional unit 24. These signals are transmitted as signal-ended signals (having a true logic value) to functional unit 24. IC 10 includes a plurality of N+1 generation circuits 13 coupled to receive the single-ended signals received from functional unit 12 and to convert these to differential signals having both true and complementary logic values. For example, a first generation circuit 13 is coupled to receive D0 at a true logic value, and is configured to produce true (D0) and complementary (DX0) logic values for transmission across the boundary between clock/voltage domain #1 and clock/voltage domain #2.

In clock/voltage domain #2, the differential signals may be received by corresponding level shifters 15. Since the supply voltages received by the two domains may be different, the voltage swing of the logic signals (i.e. the difference between a logic high and a logic low) may also be different. Each level shifter 15 may thus shift the voltage levels of the signals received from the first domain to levels that are appropriate for operation in the second domain. In this particular embodiment, both of the domains share a common ground node (or reference node), and thus the voltage levels for logic 0's may be the same for both domains. However, the logic level for a logic 1 in clock/voltage domain #1 may be approximately the same as the supply voltage Vdd1, while a logic 1 may have a voltage level approximately the same as supply voltage Vdd2 in clock/voltage domain #2. Accordingly, each level shifter 15 may translate a logic 1 received from the first domain at approximately Vdd1 to a logic 1 at approximately Vdd2. Additionally, as further discussed below, each level 15 may be optimized for use with certain types of latches used to resolve metastability that may occur when signals are received in clock/voltage domain #2 without sufficient setup/hold time.

Each level shifter 15 in the embodiment shown may output a differential signal having the true and complementary logic values, with the appropriate voltage levels for the second domain. The differential signals output by a given instance of level shifter 15 may be received by a corresponding instance of synchronizer 20. Each synchronizer 20 may include a number of latch circuits, and may be used to synchronize signals received from the first domain with the clock signal (Clk2P) in the second domain. As previously noted the clock frequency in the first domain, Clk1P, may be different from the frequency of the clock signal in the second domain. The latches used in each synchronizer 20 may thus be used to resolve metastability issues that may occur when signals are received without allowing for the proper amount of setup/hold time. In addition, each synchronizer 20 may also convert the differential signals back into single-ended signals. The output of each synchronizer 20 may have a logic value corresponding to the true logic value of the signal originally transmitted by functional unit 12. The signals output from each synchronizer 20 may be received by functional unit 24.

Figure 2:
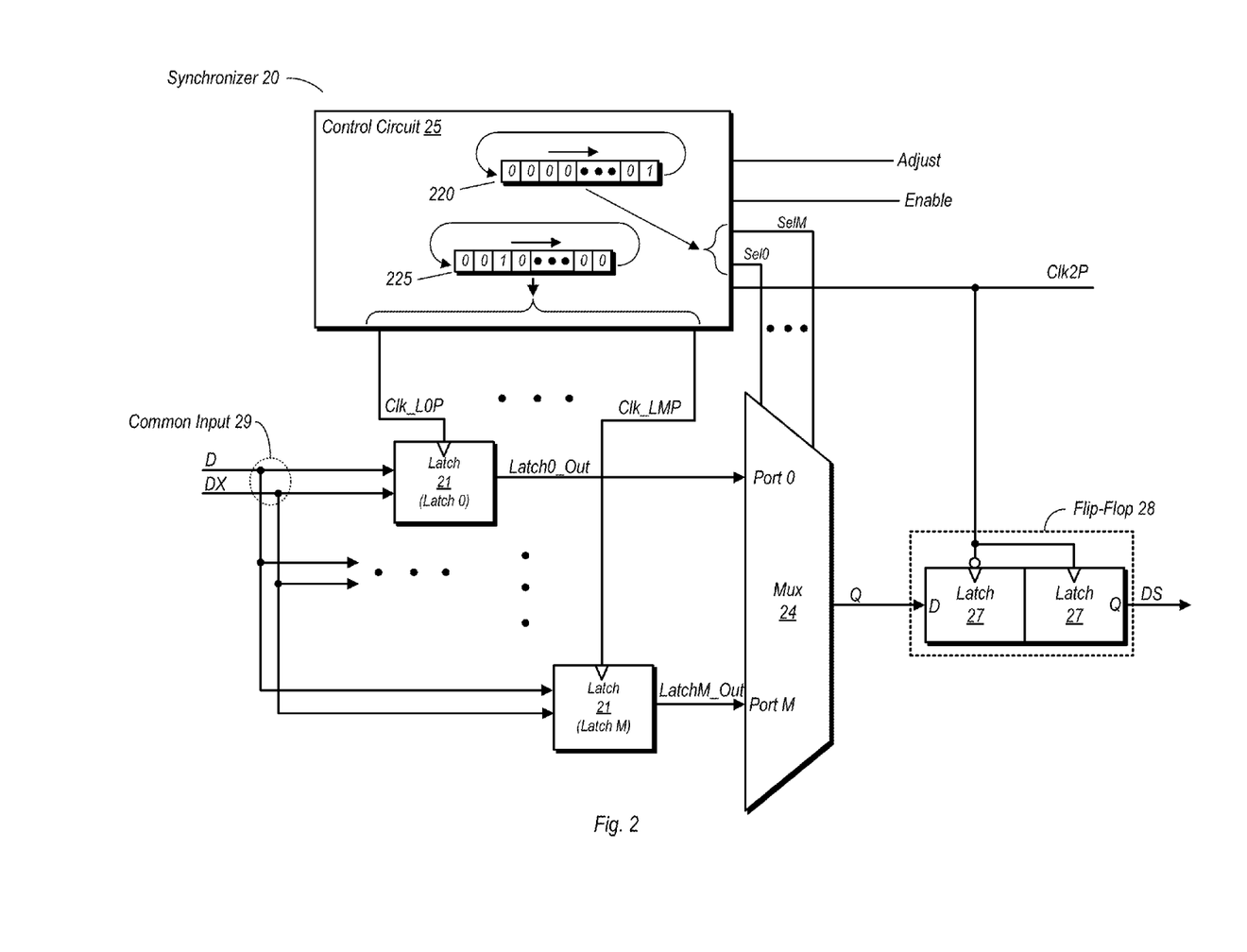
FIG. 2 is a diagram of one embodiment of a synchronizer.

FIG. 2 is a diagram of one embodiment of a synchronizer. In the embodiment shown, synchronizer 20 includes a plurality of latches 21, each of which is coupled to receive data from a common (i.e. the same) input 29. In the embodiment shown, synchronizer 20 includes M+1 latches 21, wherein M is an integer number of at least one. An output of each of latches 21 is coupled to a corresponding input of multiplexer 24. Multiplexer 24 is also coupled to receive a corresponding number of select signals, and in this embodiment, is implemented as a one-hot multiplexer. Thus, at any given time, only one latch output is selected to pass data to the Q output of multiplexer 24.

Each of the latches 21 may latch data responsive to receiving a clock pulse on its respective input. As used herein, the term 'latch', when used as a verb, may be defined as the inputting of data into a storage circuit when the storage circuit is transparent and thus able to receive data. The term 'transparent' when used herein, may refer to the state of a storage element when data can be written therein and when previously stored data may be overwritten, whereas 'non-transparent' may refer to the state of a storage element wherein new data may not be overwrite currently stored data, even if new data present on its data input. When used as a noun herein, the term 'latch' may be defined as a clocked storage element having a single stage. The clock signals discussed herein may be short pulses (e.g., a duty cycle of less than 50%), so the single-state latches may function as flip-flops. That is, they may latch data when the clock transitions high and hold the latched value at their output for the remainder of the cycle (including when the clock falls low again). Thus, the latches described herein may be differentiated from a conventional flip-flop, which may be defined herein as a storage element having two different stages (and which may be constructed of two latches coupled in series).

Synchronizer 20 is arranged such that only one of latches 21 is transparent at any given time. Moreover, synchronizer 20 is arranged such that the latches 21 thereof become transparent in a rotating order, or in other words, in a repeating sequence. For example, in an embodiment having four instances of latch 21, indicated as latch 0, latch 1, latch 2, and latch 3, latch 0 may be the first to become transparent while the other three latches remain non-transparent. Latch 1 may be the next latch to become transparent, with latch 0, latch 2, and latch 3 remaining non-transparent. This may be followed by latch 2 becoming transparent with the other three latches remaining non-transparent, then latch 3 becoming transparent with the other three latches remaining non-transparent. The sequence may then repeat itself beginning with latch 0 again. Synchronizer 20 may thus be thought of as having a plurality of data paths coupled in parallel between the common input 29 and the output 'Q' of multiplexer 24 (which is discussed below), with a latch circuit of only one data path active at any given time, and with the latch circuits of the data paths being activated in a repeating sequence. The structure of synchronizer 20 may also be thought of as being similar to a first-in, first-out (FIFO) memory, in which data is written into given locations (in this case, latches 21) in a sequential order, and subsequently read from the same locations in the same, sequential order. Each of latches 21 may be activated by a corresponding logic '1' output by control circuit 25 to its respective clock input. For example, control logic 25 may output a logic '1' on Clk_L0P to latch 0 during a first cycle, while a logic '0' may be output to the clock input of each of the other latches. The logic '1' may progress from the clock input of one latch to the next on each successive cycle of Clk2P. The total number of latches activated during a given sequence may depend on the setting of an adjustable feedback loop in control logic 25. Depending on the adjustable feedback loop length, the logic '1' in the loop will cycle through M, M−1 . . . two, or one latch position(s).

Since the incoming data received through common input 29 is not synchronized to the second clock signal, Clk2P, signals carrying the data may arrive at the input of a transparent one of latches 21 without the proper amount of setup/hold time. Accordingly, a transparent one of latches 21 may not be able to, at least initially, correctly interpret the incoming logic value, and may possibly enter a metastable state. However, over the remaining clock cycles in which it is non-transparent, the same latch 21 may resolve the metastability and thus settle on a particular logic value for the received data. In general, for a given number of clock cycles of the repeating sequence discussed above, a particular latch may latch data on one of the particular clock cycles and may resolve any occurring metastability on the remaining clock cycles. As is discussed below, the number of clock cycles between the time data is written into a particular latch and read from the particular latch (by causing the multiplexer to select its output) may be adjustable.

Latches 21 may become transparent or non-transparent under the control of control circuit 25. In particular, control circuit 25 is configured to provide clock pulses, in sequence, to latches 21. A first latch 21 is coupled to receive a first clock pulse, Clk_L0P, from control circuit 25, while the $(M+1)^{th}$ latch is coupled to receive the clock pulse Clk_LM from control circuit 25. Furthermore, control circuit 25 is configured to provide a clock pulse to only one latch 21 at a time. Accordingly, at any given time, no more than one latch 21 is transparent. Furthermore, if the clock pulses provided to the latches have a duty cycle that is less than 50% (as in this embodiment), then at those times between clock pulses, none of latches 21 are transparent. The clock pulses may be provided to latches 21 in a repeating sequence. For example, Latch 0 may receive a first clock pulse, Latch 1 (not shown, although it is understood to be present) may receive a second clock pulse, and so on up through Latch M. It is also noted that control circuit 25 is configurable to adjust a number latches that may be activated during operation. For example, if an embodiment of synchronizer 20 includes eight latches, the control circuit 25 thereof may be adjustable to cause only four of the latches to be activated for one particular operational configuration. The adjustment of the number of latches activated may be programmed through a programming input to control circuit 25 labeled here as 'Adjust'.

Control circuit 25 as shown in FIG. 2 may assert selection signals provided to multiplexer 24 in a sequence corresponding to that in which latches 21 are activated. In general, multiplexer 24 may assert Sel0 first (to select the output of Latch 0), Sel1 next (to select the output of Latch 1), and so on. It is noted however, that a cycle upon which a given selection signal is asserted may not be the same as that in which its corresponding latch is activated to latch data. For example, Latch 0 may become transparent during a first cycle, while Latch0_Out may be selected by the assertion of Sel0 one or more cycles subsequent to the first cycle. The number of cycles between the time a particular latch 21 is activated to latch data and when its output is subsequently selected by multiplexer 24 is another adjustable parameter of synchronizer 20 that may be programmed through the 'Adjust' input. In general, the number of cycles between the time a given latch 21 is activated to latch data and a time the output of the given latch 21 is selected by multiplexer 24 may vary within a range that is limited on the high end by the number of latches 21 to be activated during the entirety of a sequence. For example, if four latches 21 are activated during a given sequence, the given sequence thus consumes four operational cycles. Within these four operational cycles, multiplexer 24 may select the output of a given latch either one, two, or three operational cycles after the cycle in which it has been written, depending on how it is programmed through the 'Adjust' input. This delay in selecting the number of operational cycles between writing data to a latch 21 and reading data from the same latch 21 (by way of multiplexer 24 selecting its output) may allow time for the resolution of metastability issues that may occur when data is latched without the optimal amount of setup and hold time.

The functioning of control circuit 25 may be similar to that of circuitry used to generate read and write pointers for a FIFO. The write pointer may correspond to a signal that generates the clock pulses provided to corresponding ones of latches 21. The read pointer may correspond to a signal that generates the selection signals to multiplexer 24. The spacing, in time, between these signals may be set in a manner similar to the spacing of a read and write pointers to ensure that a storage location (in this case a latch 21) is not overwritten before it has been read.

Various types of circuitry may be used to implement control circuit 25. In one embodiment, one or more shift registers may be used to generate the signal or signals that result in assertion of the clock pulses to the latches 21 and the selection signals provided to multiplexer 24. In one exemplary embodiment, as shown in FIG. 2, control circuit 25 may include a first shift register 225 to generate the clock pulses and a second shift register 220 may be used to generate the selection signals. Each of the shift registers 220 and 225 may be seeded with a single logic 1 in one position and a logic 0 in each of the remaining positions. The shift registers 220 and 225 may also include adjustable feedback in order to implement a selected sequence. The logic 1 from shift register 225 may be used to generate the clock pulse to be provided to the currently selected latch 21, while a logic 1 from shift register 220 may be used to assert a select signal provided to multiplexer 24. The relative positions of the logic 1's in shift registers 220 and 225 may be different in order that an output of a given latch 21 is not selected by multiplexer 24 during a same cycle in which it is transparent.

In other embodiments, control circuit 25 may be implemented with a single shift register and additional supporting combinational logic, a state machine, by a processor executing instructions, or any other suitable hardware and/or software. In general, control circuit 25 may be implemented in any manner that can provide the desired sequence and/or any manner similar to that which read and write pointers are generated for a FIFO. Furthermore, control circuit 25 may be implemented such that it is programmable to control the particular number of available latches that are activated during a sequence of operations, and to control a number of operational cycles between the time data is written to a given latch and read from the given latch.

Controlling the number of cycles between the time a latch is written to and read from, as well as the number of latches activated during a given sequence may optimize the use of synchronizer 20 for particular applications. For example, in applications in which a higher bit error rate (BER) is tolerable, fewer cycles may be allotted for metastability resolution, thereby allowing for greater data throughput. This may also allow fewer latches to be activated during a given sequence. Conversely, in applications where keeping the BER low is desirable, more operational cycles may be allotted for metastability resolution. Correspondingly, more latches may be activated over the course of such a sequence. In general, the programmability of control circuit 25 may allow for fine-tuning its operation to an optimal trade-off between BER and data throughput.

In addition to providing the function of selecting a latch output to pass data to flip-flop 28, multiplexer 24 in the embodiment shown may also satisfy min-delay padding requirements. That is, multiplexer 24 may eliminate fast paths that can give rise to a race condition in which a signal can unintentionally propagate through multiple storage elements and thus cause erroneous circuit operation downstream. Since multiplexer 24 may select the output of a given latch 21 during an operational cycle subsequent to when the given latch is transparent, it may effectively block signal propagation that might otherwise give rise to a race condition.

Since synchronizer 20 can be implemented using single-stage latches in parallel rather than multi-stage flip-flops in series, circuit area may be saved. More particularly, since a flip-flop generally requires two latches, twice as many latches may be used to implement a serial synchronizer relative to the number of latches used in synchronizer 20. Furthermore, since delay elements may be implemented between stages of a serial synchronizer, additional area may be consumed relative to synchronizer 20, as multiplexer 24 may implement min-time delay padding. The delay elements in a serial synchronizer may waste time, since they do not contribute to metastability resolution. Accordingly, synchronizer 20, by implementing the latches in parallel data paths and using multiplexer 24 to provide min-time delay padding, may reduce the number of circuit elements that provide no contribution to metastability resolution.

As noted above, synchronizer 20 in the embodiment shown includes a flip-flop 28 coupled to the Q output of multiplexer 24. Flip-flop 28 in some embodiments is a master-slave flip-flop having two latches 27 coupled in series. A first latch 27 (having the D input coupled to the Q output of multiplexer) is arranged to be transparent during the low portion of Clk2P. The second latch is arranged to be transparent during the high portion of Clk2P. In some embodiments, flip-flop 28 may be further arranged to be an edge-triggered latch in which data transitions in a given one of latches 27 occur responsive to a clock edge rather than to a level of the received clock signal.

Figure 3:
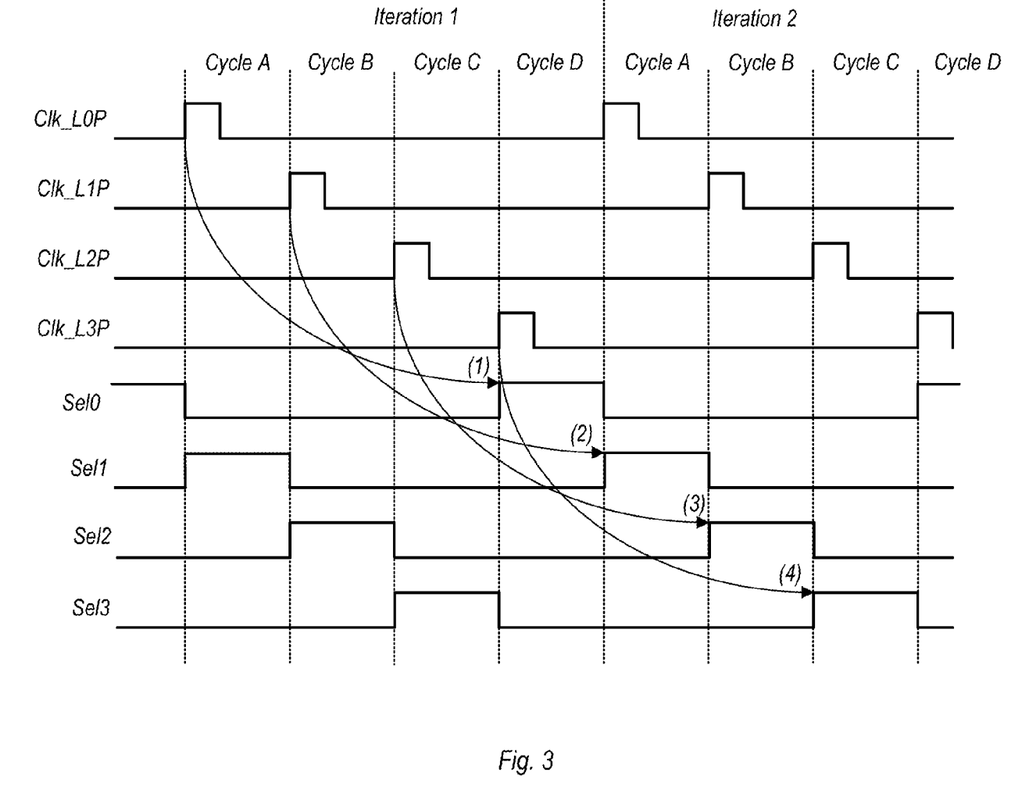
FIG. 3 is a timing diagram illustrating the operation of one embodiment of a synchronizer.

FIG. 3 is a timing diagram further illustrating operation of synchronizer 20. The example shown in FIG. 3 may apply to more than one embodiment of synchronizer 20. FIG. 3 may apply to embodiments having four data paths, each of which is enabled during the illustrated sequence, and in which the feedback path discussed above may be fixed or adjustable. FIG. 3 may also apply to an adjustable feedback embodiment of synchronizer 20 having more than four data paths, but for which only four are enabled. Irrespective of the particular embodiment to which FIG. 3 is applied, the example shown here includes the operation of data paths including four latches, Latches 0-3, and a multiplexer having four select inputs, Sel0-Sel3, only one of which is asserted at a given time. Each of Latches 0-3 may receive a corresponding one of clock pulses Clk_L0P-Clk_L3PP, which are generated based on the clock signal, Clk2P, of the receiving clock domain.

Iteration 1 of the sequence illustrated in FIG. 3 begins with the assertion of a clock pulse, Clk_L0P, on a clock input of Latch 0 during Cycle A. Responsive to receiving the clock pulse, Latch 0 becomes transparent and remains so until the clock pulse falls low. After the clock pulse falls low, Latch 0 is non-transparent. If the data was received by Latch 0 during its transparency phase without the proper setup and hold time, Latch 0 may initially be in a metastable state during Cycle A. However, this metastability may be resolved during the remaining in Cycle A and during subsequent cycles in which Clk_L0P is inactive. In this particular example, as shown by (1), Sel0 is asserted at the beginning of Cycle D, which is three full cycles subsequent to when Clk_L0P is asserted. Accordingly, three full cycles are provided for metastability resolution, i.e. from the time Latch 0 initially becomes transparent at the beginning of Cycle A to the time in which data is read in Cycle D.

At the beginning of Cycle B in Iteration 1, Clk_L1P is asserted to cause Latch 1 to become transparent. As shown by (2), Sel1 is asserted three cycles later, in Cycle A of Iteration 2. Similarly, Clk_L2P is asserted during Cycle C of Iteration 1, with Sel2 being asserted three cycles later, during Cycle B of Iteration 2, as shown in (3). Clk_L3P is asserted at the beginning of Cycle D of Iteration 1, with Sel3 being asserted three cycles later, in Cycle C of Iteration 2, as shown by (4). In general, FIG. 3 illustrates one exemplary scenario in which data is written into a latch on a given operational cycle and read from that same latch 3 cycles later. Thus, during the illustrated sequence, three operational cycles elapse from the beginning of a write to a latch to the beginning of a read from the latch. During this allotted time, a metastable state in the latch that may occur if data is received without optimal timing may be resolved.

Furthermore, Sel0, Sel1, Sel2, and Sel3 of FIG. 3 can by shifted right by a single cycle. This provides two cycles for metastability resolution in each latch 21. Shifting by two cycles provides three cycles of metastability resolution. Shifting by three cycles provides four cycles of metastability resolution. In this manner, the BER of the overall circuit can be adjusted at the cost of additional latency.

The iterations shown in FIG. 3 may repeat indefinitely during operation of the system in which synchronizer 20 is implemented. The sequence may remain the same for each iteration, and thus each of the latches may be provided substantially the same amount of time to resolve any metastability issues that may occur when data is initially latched. It is noted that metastability may not occur in all cases when a given latch is transparent, although there is a non-zero probability that metastability will occur in some cases since the incoming data does not have any relationship to the second clock signal, Clk2P.

Figure 4:
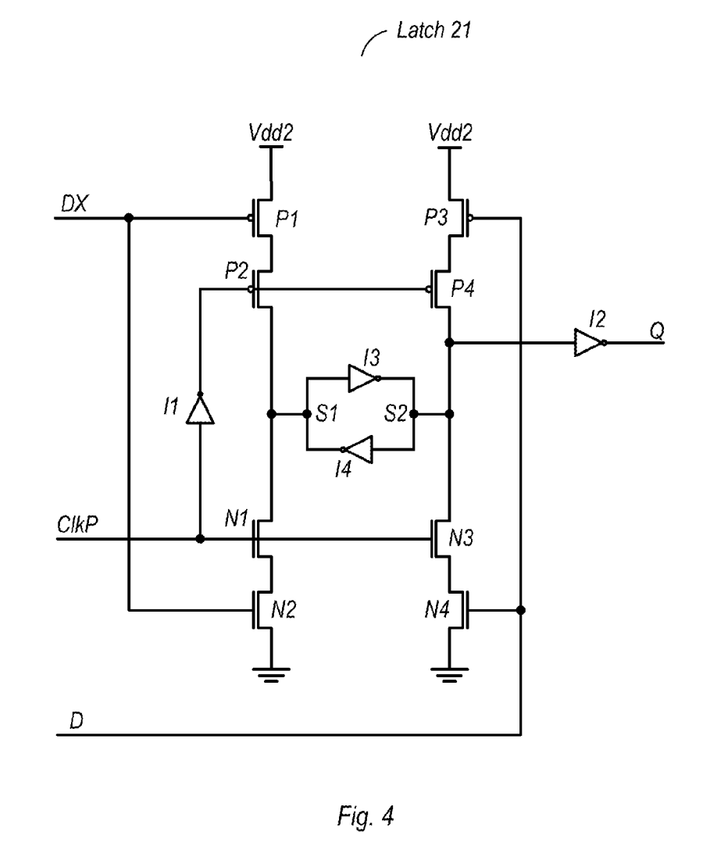
FIG. 4 is a schematic diagram of one embodiment of a latch used in a synchronizer.

Turning now to FIG. 4, a schematic diagram of one embodiment of latch 21 as used in a synchronizer 20 is shown. In the embodiment shown, latch 21 includes a true data input, D, a complementary input DX, and a clock input, Clk_P. As noted above, the true and complementary input signals may be provided from a level shifter 15, which is discussed in further detail below.

In the illustrated embodiment, as well as the other circuit embodiments discussed herein, transistors designated with a 'P' (e.g., P1) are p-channel metal oxide semiconductor (PMOS) transistors. Transistors designated with an 'N' (e.g., N1) are n-channel metal oxide semiconductor (NMOS) transistors. It is noted, however, that embodiments of the various circuits discussed herein may be implemented with other types of transistors. Accordingly, the disclosure is not intended to be limited to the embodiments explicitly discussed herein.

Latch 21 in the embodiment shown is configured to be transparent when ClkP is high. When ClkP is high, a logic high is received on the gate terminal of transistor N1, while a logic low is provided to transistor P2 via inverter I1. When ClkP is low, latch 21 is non-transparent and thus no data may be latched into latch 21.

If DX is low and D is high when latch 21 is transparent, transistor P1 may be activated. Node S1 may be pulled toward Vdd2 through the pull-up path through P1 and P2. Transistor N4 may be activated responsive to the high on input D. Node S2 may be pulled low toward ground through N3 and N4. The storage element of latch 21, which includes cross-coupled inverters I3 and I4, may overwrite previously stored data and maintain the high on S1 and the low on S2 after ClkP falls low. If DX is high and D is low, S1 may be pulled low through N1 and N2, while node S2 may be pulled high through P3 and P4. The output of latch 21 may be conveyed from node S2 through inverter I2, and may be logically equivalent to the D input once the incoming data has been written into the storage element.

Figure 5:
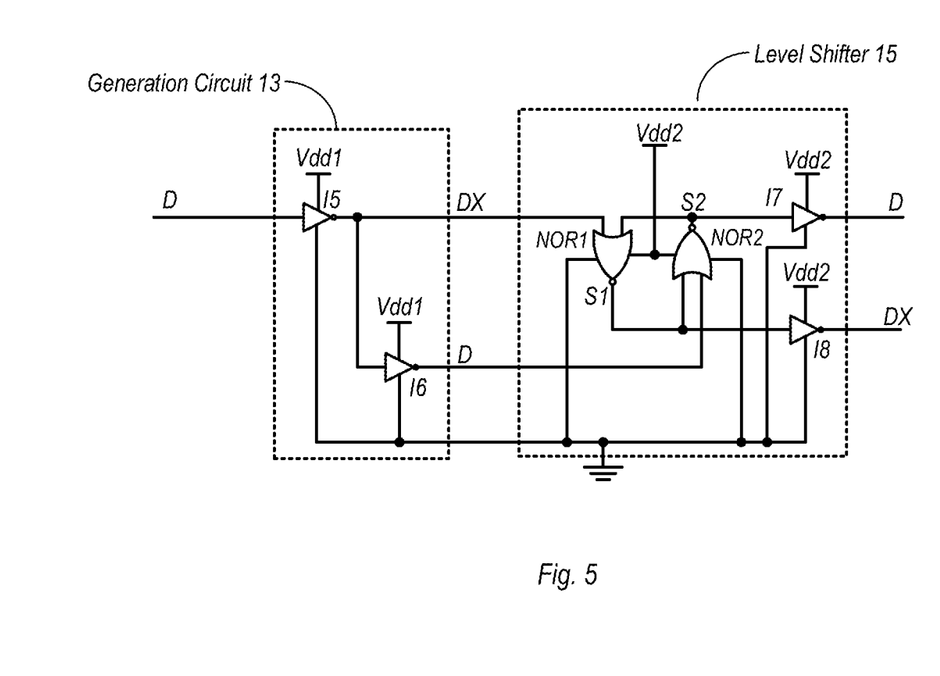
FIG. 5 is a logic diagram of one embodiment of a level shifter.

One advantage of receiving true and complementary data in latch 21 is that, during the writing of data to the storage element therein, one portion of the circuit will begin pulling a storage node up toward Vdd2 at substantially the same time that the other portion of the circuit begins pulling the other storage node down toward ground. To achieve the near simultaneous reception of true and complementary data values, various embodiments of level shifter 15 may be used in conjunction with latch 21. Turning now to FIG. 5, a logic diagram illustrating one embodiment of level shifter 15 is shown.

In the example of FIG. 5, level shifter 15 is coupled to receive true data, D, and complementary data, DX, from generation circuit 13. The transistors of level shifter 15 are in the receiving voltage domain supplied by Vdd2, while the transistors of generation circuit 13 are in the transmitting voltage domain supplied by Vdd1. In some instances, Vdd1 may be greater than Vdd2, while in other instances, Vdd2 may be greater than Vdd1. Accordingly, the transistors in the circuits shown in FIG. 5 as well as in the other level shifter embodiments discussed below may be sized accordingly to up-shift or down-shift the logic voltages as desired.

Level shifter 15 in the illustrated embodiment implements a set-reset (SR) latch including NOR gates NOR1 and NOR2. By implementing the storage element as an SR latch, a state can be written (or overwritten) without causing crowbar currents. Furthermore, the circuit may be arranged to cause the switching of the state nodes, S1 and S2, to occur nearly simultaneously (e.g., to within 10 picoseconds of one another). Thus, the D and DX outputs of level shifter 15 (transmitted via inverters I7 and I8, respectively), may switch at the substantially the same time. Thus, a latch 21 coupled to receive the D and DX output from a level shifter 15 may detect the switching of its inputs at substantially the same time, and may thus provide the advantages as discussed above.

Figure 6A:
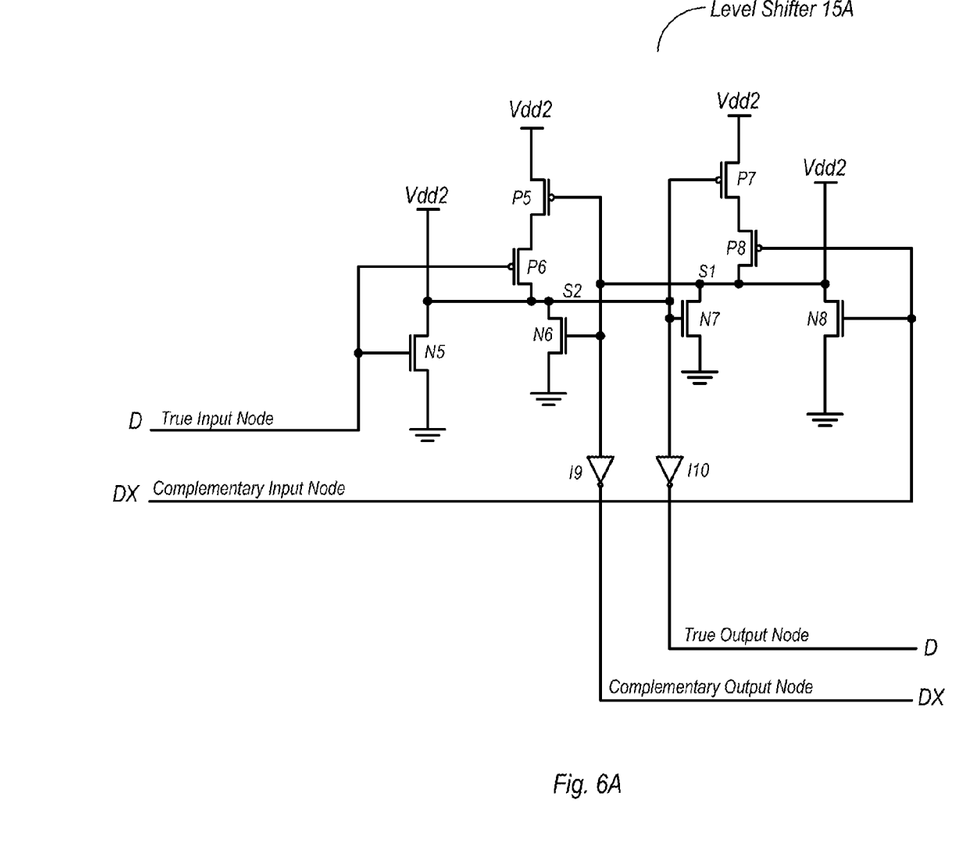
FIG. 6A is a schematic diagram of one embodiment of a level shifter.

FIG. 6A is a schematic diagram illustrating one embodiment of a level shifter that is logically equivalent to level shifter 15 shown in FIG. 5. In the embodiment shown, level shifter 15A includes a state element, which is formed by first and second NOR gates. The first NOR gate is formed by transistors N5, N6, P5, and P6. The second NOR gate is formed by N7, N8, P7, and P8. The true output of the circuit is provided via inverter I10, while the complementary output of the circuit is provided via inverter I9. The transistors of level shifter 15 may be sized to shift incoming signals into a higher voltage domain (when Vdd2>Vdd1) or into a lower voltage domain (when Vdd2<Vdd1).

The arrangement of level shifter 15A may prevent crowbar currents from occurring during the switching of the internal state nodes, S1 and S2, from one state to another. Furthermore, the arrangement of the circuit may also reduce the difference between the switching times of the true and complementary outputs when their corresponding inputs arrive at different times.

The left half of the circuit (including P5, P6, N5, and N6) is controlled by the true input node, while the right half of the circuit (including P7, P8, N7, and N8) is controlled by the complementary input node. When paired with generation circuit 13 as shown in FIG. 5, new data may arrive on the complementary input node slightly before arriving on the true input node.

Operation of the circuit is now explained, beginning with initial conditions of node S1 and the true input node being in a logic low state, while node S2 and the complementary input node are each in a logic high state. When S1 and the true input node are both low, P5 and P6 are both active to pull node S2 to a logic high state. When S2 is high, transistor N7 is active to pull S1 low. When the complementary input node is high, transistor N8 is active, also pulling S1 low.

When a logic low arrives on the complementary input node, the logic low may activate transistor P8, while deactivating transistor N8. Node S2 initially remains in the low state, since transistor N7 is still active. When a logic high arrives on the true input node, transistor N5 is activated while transistor P6 is deactivated. The deactivation of transistor P6 blocks the pull-up path through N5 and P6, while the activation of N5 creates a pull-down path between S2 and ground. Accordingly, S2 is pulled low, and thus causes the activation of P7. When P7 is activated, a pull-up path is created between S1 and Vdd2, in part due to the prior activation of P8 when a low was received on the complementary input node. Since the pull-up path from S1 to Vdd2 is not activated until S2 is pulled low, the amount of time between the switching of the true and complementary output nodes may be reduced relative to the amount of time between receiving the corresponding inputs.

Subsequent to writing S1 to a logic high and S2 to a logic low as described above, a logic high may be received on the complementary input node, with a logic low following on the true input node shortly thereafter. Responsive to the logic high on the complementary input node, transistor P8 is deactivated, while transistor N8 becomes active and causes S1 to be pulled low. When S1 is pulled low, transistor N5 is activated. When the true input falls low, transistor P6 is activated, and thus a pull-up path is formed between S2 and Vdd2. In the operation described in this paragraph, the complementary output node may switch slightly before the true output node. However, if the delay for activating N8 is sufficiently large, then the difference in switching times may be minimized if the true input node falls low before N8 is fully active and causing S1 to be pulled low.

Figure 6B:
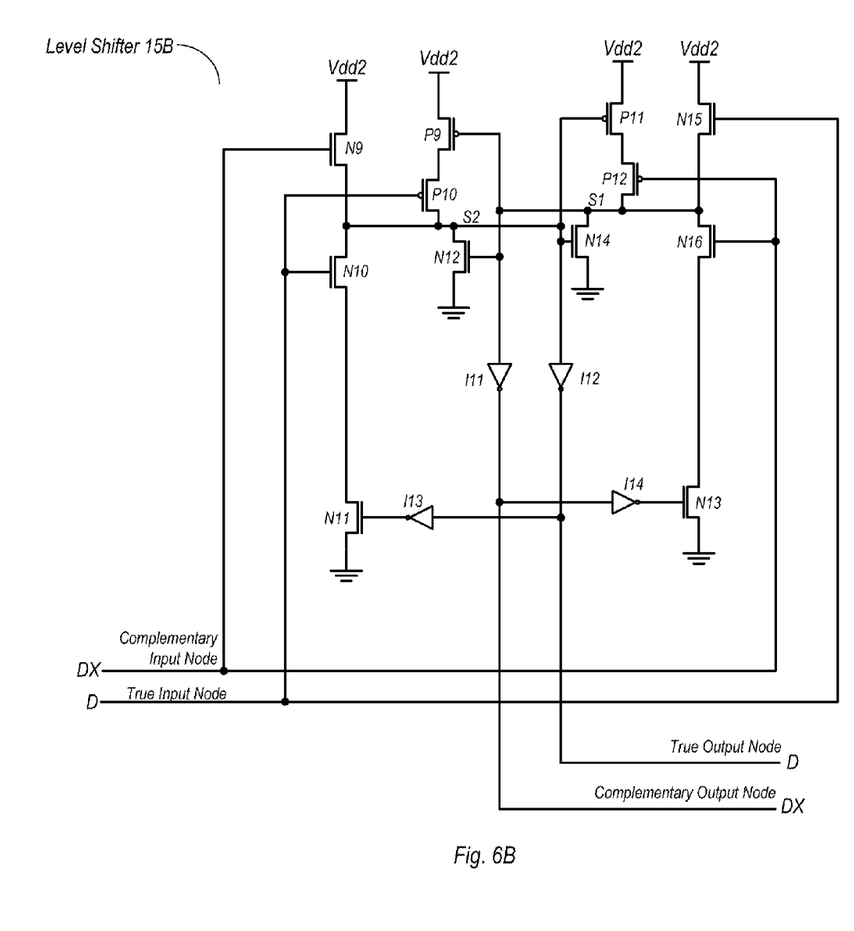
FIG. 6B is a schematic diagram of another embodiment of a level shifter.

FIG. 6B is a schematic diagram of another embodiment of a level shifter. Similar to level shifter 15A, level shifter 15B includes a first NOR gate (formed by N10, N12, P9, and P10) and a second NOR gate (formed by N14, N16, P11, and P12). Level shifter 15B also includes four extra NMOS transistors, N9, N11, N13, and N15, and two extra inverters, I13 and I14. The effect of the extra devices may be to reduce the amount of time between switching of the outputs relative to the embodiment shown in FIG. 6A. This may be accomplished at least in part by causing the internal state nodes to be pulled up faster than in the previously discussed embodiment.

The pull-up time can be reduced by transistors N9 and N15. If the complementary input node transitions high, transistor N9 is turned on and node S2 is pulled up to a voltage of approximately Vdd2-$V_{th}$, where $V_{th}$ is the transistor threshold voltage. When P9 and P10 are subsequently activated, S2 may be pulled the rest of the way up to a voltage of approximately Vdd2. Similarly, when a logic high arrives on the true input node, N15 is activated and pulls S1 up to a voltage of approximately Vdd2-$V_{th}$. Node S1 may be pulled the rest of the way up to a voltage of approximately Vdd2 responsive to the activation of transistors P11 and P12. Since transistors N9 and N15 pull their respectively coupled internal state nodes up part of the way, to approximately Vdd2-$V_{th}$, the remainder of the pull-up operation may occur faster once the PMOS pull-up paths coupled to the respective state nodes are activated.

Pulling down of the internal state nodes may be accomplished using transistors N16 and N10. When the complementary input node transitions high, transistor N16 is activated. Transistor N13 is on prior to the transition of the complementary input node, since S1 is also high (the high from S1 is inverted low by I11 and re-inverted high by I14, which drives the gate of N13). Thus, when transistor N16 is activated, a pull-down path is provided between S1 and ground, and as a result, P9 is also activated. The transitioning high of the complementary node also deactivates P12, cutting off the pull-up path between Vdd2 and node S1, and thus preventing crowbar currents. When the true input node falls low, P10 is activated. Thus, S2 is pulled up toward Vdd2, which in turn causes the activation of N14 and the creation of a second pull-down path between S1 and ground. When S1 falls low, I11 outputs a logic high, which is inverted again to a logic low by I14. When the output of I14 falls low, transistor N13 is deactivated, but S1 is nevertheless held low by the activated N14.

Pulling down S2 may be accomplished in a similar manner. At the time the true input node transitions high, N11 is active, and thus the activation of N10 creates a pull-down path between S2 and ground. This in turn results in the activation of P11, and the creation of pull-up path between S1 and Vdd2, as P12 is activated by the complementary input falling low in concert with the true input transitioning high. Transistor N12 is activated to create a second pull-down path between S2 and ground responsive to S1 being pulled high. Meanwhile, the low in S2 is inverted high by I12 and low again by inverter I13, thereby deactivating N11. Thereafter, S2 is held low by N12 until the next transition of the inputs.

Figure 6C:
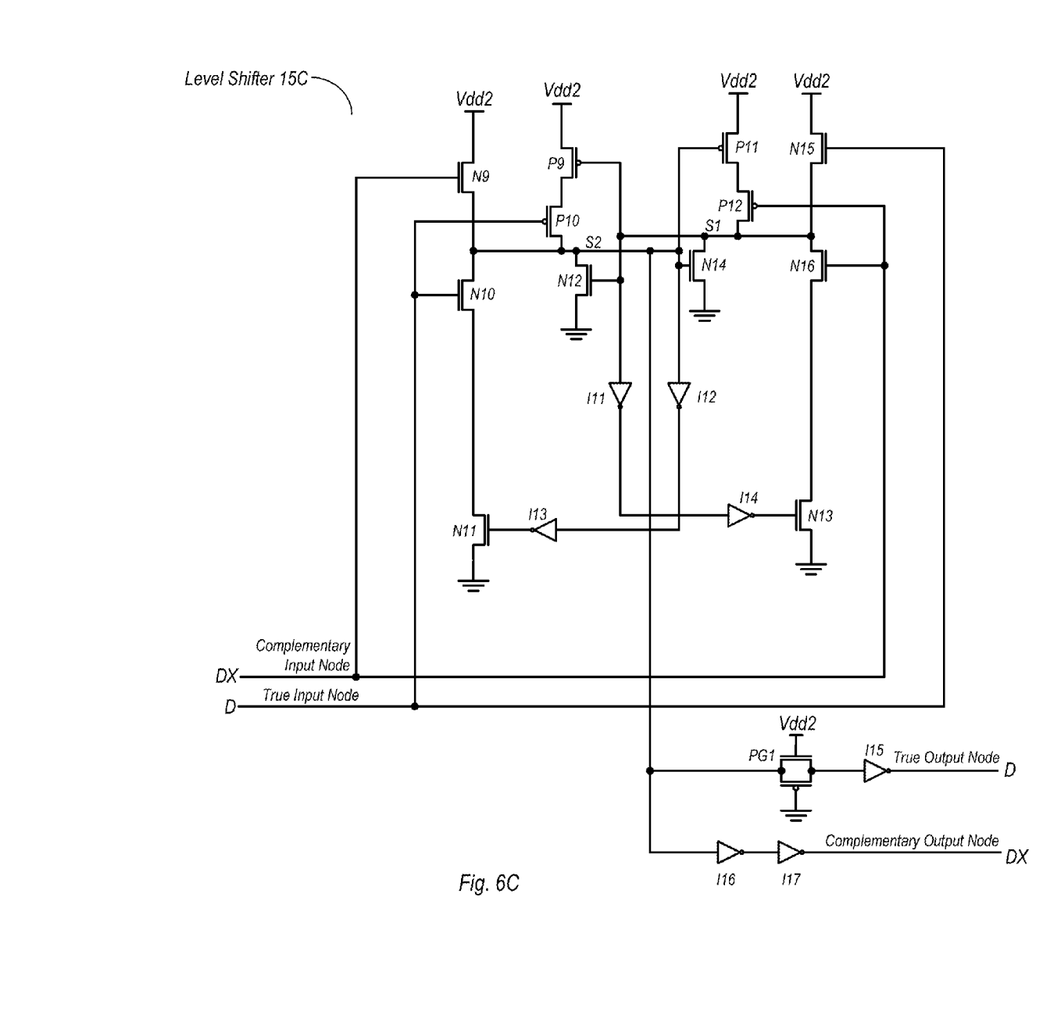
FIG. 6C is a schematic diagram of a third embodiment of a level shifter.

FIG. 6C illustrates a third embodiment of a level shifter circuit. Level shifter 15C incorporates features from the previously discussed embodiments. However, in level shifter 15C, the output signals are derived from a single node (S2 in this case, although a similar embodiment could be constructed in which the outputs are derived from S1). Embodiments of a level shifter combining single-node derived outputs without the extra devices introduced in the discussion of level shifter 15B are also possible and contemplated.

The complementary output of level shifter 15C, DX, is logically equivalent to node S2 in this embodiment. Accordingly, S2 is coupled to the complementary output node through inverters I16 and I17. Node S2 is coupled to the true output node through I15 and passgate PG1, which is non-inverting. Using two inverters in one output path and a passgate-inverter combination in the other path may reduce the delay relative to embodiments that include the inverters but no passgate. Thus, the difference in propagation delay from S2 to both the true and complementary outputs may be negligible. Furthermore, in embodiments in which the output circuitry is arranged as in level shifter 15C, process, voltage, and temperature variations may be less likely to affect the difference in relative switching times between the true and complementary outputs.

As previously noted, the various level shifter embodiments discussed above may be optimized for use with latches 21, also discussed above. More particularly, by minimizing any time difference between the switching of the true and complementary signals may aid in metastability resolution when received by latch 21 from one of the level shifters disclosed herein. Embodiments of an integrated level shifter/latch circuit using any of the level shifter circuits discussed above are thus possible and contemplated.

Figure 7:
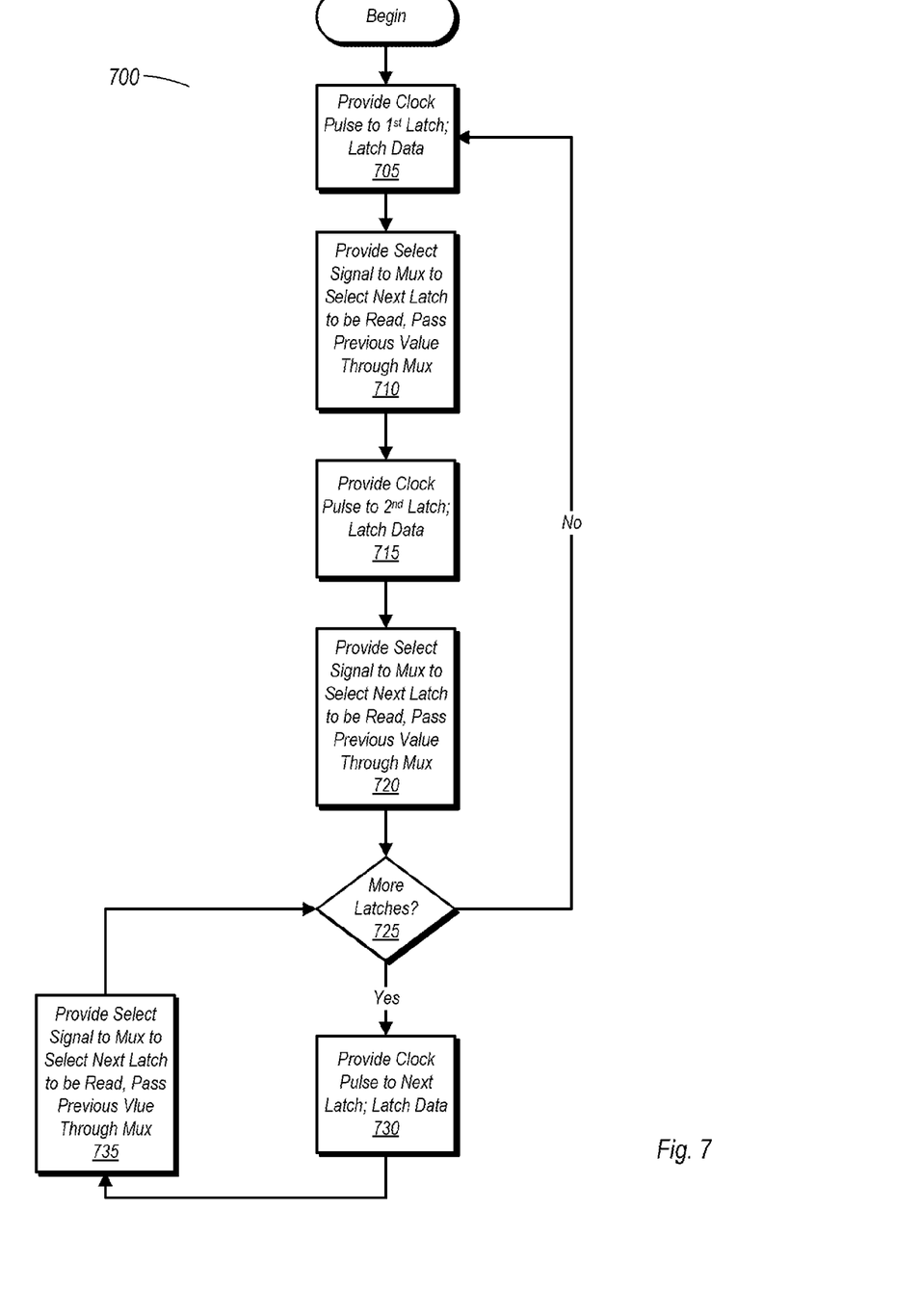
FIG. 7 is a flow diagram illustrating one embodiment of a method for operating a synchronizer.

Turning now to FIG. 7, a flow diagram illustrating one embodiment of a method for operating a synchronizer is shown. Method 700 as discussed herein may be used with any variation of synchronizer 20 and the various circuits with which it may be implemented. Furthermore, method 700 may be implemented using hardware not explicitly discussed herein.

Method 700 begins with the providing of a clock pulse to a first latch of a synchronizer (block 705). The latch is one of two or more latches implemented in two or more corresponding parallel data paths of the synchronizer. The first latch may receive the clock pulse exclusive of the latches of all other data paths. When the first latch receives the clock pulse, it becomes transparent and may thus latch data received on its input.

A select signal is provided to a multiplexer to select, as its active input, an output of a next latch to be read (block 710). The selecting of the output of the next latch to be read occurs concurrently with the first latch receiving the clock pulse. The next latch to be read is different from the first latch, and may be storing a previous value that was written thereto. When the output of the next latch to be read is selected, data previously written thereto may pass through the multiplexer. The selected latch may have also resolved its state from a metastable state that could occur if the data was received without optimal setup and hold time.

Subsequent to the first clock pulse falling low, a second clock pulse is provided to a second latch, exclusive of latches in the other parallel data paths (block 715). The second latch may also latch data at this time, while the first latch may be resolving any metastability issues present from the previous clock cycle. Concurrent with the assertion of the second clock pulse, a second select signal may be asserted to cause the multiplexer to select the output of the another latch to be read (block 720) that is different from the second latch. Data previously latched into the latch may pass through the multiplexer when the second select signal is asserted.

If the synchronizer includes only two data paths, or is only using two of more than two available data paths (block 725, no), then the method returns to block 705. If more than two data paths are to be used in the synchronizer operation, the method proceeds to block 730, in which another clock pulse is provided exclusively to the latch of another data path. The latch may latch the data responsive to the clock pulse. Concurrently, a select signal may be provided to the multiplexer to select the output of the yet another latch to be read (block 735). The method may then proceed back to 725. For each additional latch, block 730 and 735 may be repeated. Once the synchronizer has cycled through the writing to and reading from the latches of each of the data paths, method 700 may return to block 705 and repeat itself in its entirety.

Figure 8:
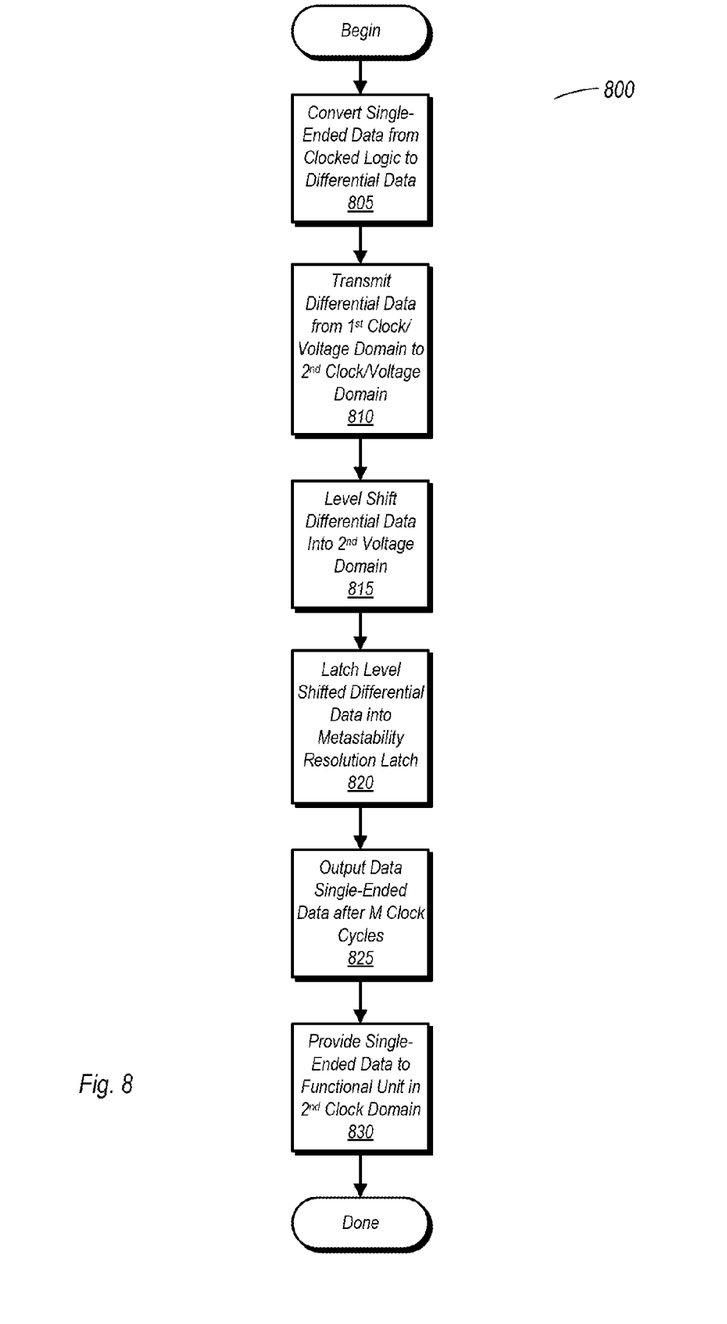
FIG. 8 is a flow diagram illustrating one embodiment of a method for transmitting signals from a first voltage/clock domain to a second voltage/clock domain.

FIG. 8 is a flow diagram illustrating one embodiment of a method for transmitting signals from a first voltage/clock domain to a second voltage/clock domain. Method 800 may be used with any of the circuit/hardware embodiments discussed above, as well as with embodiments not explicitly mentioned herein.

Method 800 begins with the conversion of a single-ended data signal in a first clock/voltage domain to differential data having true and complementary signals (block 805). After conversion to differential data, the true and complementary signals may be transmitted from the first clock/voltage domain to a second clock/voltage domain (block 810). Assuming that the supply voltages of the first and second clock/voltage domains are different, the voltage level of at least one of the true and complementary signals may be shifted (block 815). In some embodiments, both voltage domains may share a common ground, and thus shifting may be performed on the high signal, but not on the low signal.

Following the level shifting, the differential data signal may be received and latched into a latch circuit of a synchronizer (block 820). The latch circuit and the synchronizer in which it is implemented may be optimized to resolve metastability that may occur if the differential data signal is received without the proper amount of setup and hold time. The latch may be implemented in one of M parallel data paths in use in the synchronizer, and may be allotted M clock cycles to resolve the metastability. After the M clock cycles have elapsed, the synchronizer may output the data as single-ended data (block 825), after which it may be received for further processing by a functional unit in the second clock/voltage domain (block 830).

It is noted that the synchronizer disclosed herein may be used in embodiments where signals cross from one clock domain to another without crossing from one voltage domain to another. In such embodiments, circuits similar to the level shifters 15 and 15A-15C and variations thereof may be used with latches such as latch 21 or other suitable latch circuits to optimize metastability resolution without otherwise performing level shifting operation.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
  a plurality of M+1 latches each coupled to receive data through a common data input, wherein the data received through the common input is synchronized to a first clock signal in a first clock domain;
  a multiplexer having a M+1 inputs each coupled to receive data from an output of a corresponding one of the M+1 latches, and an output, wherein the multiplexer is a one-hot multiplexer configured to select one of its inputs to be coupled to the output;
  a control circuit configured to cause the multiplexer to sequentially select outputs of selected ones of the M+1 latches responsive to N successive clock pulses, and further configured to cause the selected ones of the M+1 latches to sequentially latch data received through the common data input, wherein the control circuit includes a first shift register configured to generate clock pulses to each of the M+1 latches such that only one of the M+1 latches is transparent at a given time, and a second shift register configured to generate selection signals provided to the multiplexer, such that only one selection signal is asserted at a given time, wherein the first and second shift registers are each synchronized to a second clock signal in a second clock domain; and
  a flip-flop coupled to receive the output of the multiplexer, wherein the flip-flop is synchronized to the second clock signal in the second clock domain.

2. The circuit as recited in claim 1, wherein each of the M+1 latches includes a clock input, and wherein the control circuit is configured to provide a pulse to a selected one of the M+1 latches responsive to one of the N successive clock pulses.

3. The circuit as recited in claim 2, wherein each of the M+1 latches is configured to latch data received through the common data input responsive to receiving the pulse from the control circuit and further configured to inhibit data from being latched during cycles when no pulse is received from the control circuit.

4. The circuit as recited in claim 2, wherein the control circuit is configured to select an output of the selected one of the M+1 latches responsive to one of the N successive clock pulses occurring subsequent to the one of the N successive clock pulses during which data was latched into the selected one of the M+1 latches.

5. The circuit as recited in claim 4, wherein the control circuit is adjustable to control a number of clock pulses between a cycle in which data is latched into a given one of the M+1 latches and a cycle in which an output of the given one of the M+1 latches is selected by the multiplexer.

6. The circuit as recited in claim 1, wherein responsive to a given one of the N successive clock pulses, the control circuit is configured to cause a first one of the M+1 latches to latch data and cause the multiplexer to select an output of a second one of the M+1 latches.

7. The circuit as recited in claim 1, wherein the common data input coupled to each of the M+1 latches is a differential data input including a true data input and a complementary data input.

8. The circuit as recited in claim 7, wherein each of the plurality of latches is configured to provide a single-ended data output.

9. A method comprising:
sequentially selecting inputs of a multiplexer, wherein each of the inputs of the multiplexer is coupled to an output of a corresponding one of M+1 latches, wherein the multiplexer is a one-hot multiplexer that includes M+1 inputs, and where the inputs are selected one at a time, wherein said sequentially selecting inputs of the multiplexer comprises a first shift register of a control circuit sequentially asserting select signals one at a time;
sequentially latching data into two or more of the M+1 latches, wherein each of the M+1 latches is coupled to receive data through a common data input, wherein the data received through the common input is synchronized to a first clock signal in a first clock domain, and wherein each of the M+1 latches is configured to latch data responsive to receiving a particular one of two or more successive clock pulses, wherein data is latched into the two or more of the M+1 latches one latch at a time responsive to a second shift register of the control circuit asserting two or more successive clock pulses one at a time, the first and second shift registers asserting the select signals and the clock pulses, respectively, synchronously with a second clock signal; and
providing data output from the multiplexer to a flip-flop synchronized to the clock signal in the second clock domain.

10. The method as recited in claim 9, further comprising the first shift register providing a pulse to a first one of the M+1 latches and the second shift register providing a select signal causing the multiplexer to select the output of the second one of the M+1 latches concurrent with providing the pulse to the first one of the M+1 latches.

11. The method as recited in claim 10, further comprising:
the control circuit inhibiting the pulse from being provided to each unselected one of the M+1 latches; and
each of the unselected latches inhibiting data from being latched therein when the clock pulse is not provided thereto.

12. The method as recited in claim 9, further comprising:
providing data to the common data input as a differential signal having true and complementary logic values;
providing data from an output of the multiplexer as a single-ended signal having the true logic value.

13. The method as recited in claim 9, further comprising:
the control circuit causing the multiplexer to select an output of a given one of the M+1 latches one or more cycles subsequent to when data was latched into the given one of the M+1 latches; and
causing the control circuit to change a number of cycles between a time in which data is latched into the given one of the M+1 latches and a time in which the multiplexer selects the output of the given one of the M+1 latches.

14. A synchronizer comprising:
a plurality of M+1 data paths coupled in parallel between a common data input and an output of a multiplexer, wherein each of the M+1 data paths includes one of M+1 latch circuits each coupled to receive data synchronized to a first clock signal in a first clock domain from the common data input and each having a respective output coupled to a corresponding one of M+1 inputs of the multiplexer, wherein the multiplexer is a one-hot multiplexer configured to select one of its M+1 inputs responsive to receiving a corresponding one of M+1 selection signals;
a control circuit configured to cause two or more of the M+1 latch circuits to latch data one at a time in a repeating sequence, and further configured to cause the multiplexer to select outputs of the two or more the M+1 latch circuits one at a time in the repeating sequence, wherein the control circuit is configured to cause the multiplexer to select an output of a given one of the M+1 latch circuits during an operational cycle subsequent to an operational cycle in which the given one of the M+1 latch circuits is activated, wherein the control circuit includes a first shift register configured to generate clock pulses provided to each of the M+1 latches, and a second shift register configured to generate selection signals provided to the multiplexer such that only one selection signal is asserted at a given time, wherein the first and second shift registers are synchronized to a second clock signal in a second clock domain; and
a flip-flop coupled to receive the output of the multiplexer, wherein the flip-flop is synchronized to the second clock signal in the second clock domain.

15. The synchronizer as recited in claim 14, wherein the control circuit is further configured to cause non-selected ones of the M+1 latch circuits to inhibit latching of data.

16. The synchronizer as recited in claim 14, wherein the common data input is a differential input having a true signal input and a complementary signal input, and wherein the multiplexer output is a single-ended output having a true data output.

17. The synchronizer as recited in claim 16, wherein the latch circuit of each of the M+1 data paths is coupled to receive data as a differential signal having true and complementary logic states, and wherein the latch circuit of each of the M+1 data paths is coupled to provide data on its respective output as a single-ended signal at a true logic state.

18. The synchronizer as recited in claim 14, wherein the control circuit is adjustable to activate, during the repeating sequence, any integer number of the M+1 latches between two and M+1, wherein M is an integer number greater than one.

19. The synchronizer as recited in claim 18, wherein the control circuit is configured to generate, during the repeating sequence, selection signals in order to cause the multiplexer to select the particular ones of the M+1 latches activated during the repeating sequence.

20. The synchronizer as recited in claim 18, wherein the control circuit is adjustable to control a number of cycles between a cycle in which data is latched into a given one of the M+1 latches and a subsequent cycle in which an output of the given one of the M+1 latches is selected by the multiplexer.

* * * * *

UNITED STATES PATENT AND TRADEMARK OFFICE
CERTIFICATE OF CORRECTION

PATENT NO. : 9,509,317 B2  
APPLICATION NO. : 13/755056  
DATED : November 29, 2016  
INVENTOR(S) : Masleid et al.

Page 1 of 1

It is certified that error appears in the above-identified patent and that said Letters Patent is hereby corrected as shown below:

On the Title Page

Column 1, under Title, Line 2, delete "metastablity" and insert -- metastability --, therefor.

In the Specification

In Column 1, Line 2, delete "metastablity" and insert -- metastability --, therefor.

In Column 8, Line 65, delete "can by" and insert -- can be --, therefor.

In Column 10, Line 62, delete "N5" and insert -- P5 --, therefor.

In Column 11, Line 12, delete "N5" and insert -- P5 --, therefor.

Signed and Sealed this  
Twentieth Day of June, 2017

Joseph Matal  
*Performing the Functions and Duties of the*  
*Under Secretary of Commerce for Intellectual Property and*  
*Director of the United States Patent and Trademark Office*